United States Patent [19]

Takada et al.

[11] Patent Number: 5,173,475
[45] Date of Patent: Dec. 22, 1992

[54] BI-PB-SR-BA-CA-CU-O SYSTEM SUPERCONDUCTOR

[75] Inventors: Toshio Takada; Mikio Takano, both of Kyoto; Yoshinari Miura, Hyogo; Jun Takada, Okayama; Kiichi Oda, Kurashiki; Naoichi Yamamoto, Suita, all of Japan

[73] Assignees: Kabushiki Kaisha Kobe Seiko Sho, Kobe; NEC Corporation, Tokyo; Osaka Cement Co., Ltd., Osaka; Seisan Kaihatsu Kagaku Kenkyusho, Kyoto; Toda Kogyo Corp., Hiroshima; Tosoh Corporation, Shin nanyo, all of Japan

[21] Appl. No.: 373,101

[22] Filed: Jun. 29, 1989

[30] Foreign Application Priority Data

Jul. 1, 1988 [JP] Japan .................. 63-165529
Jun. 2, 1989 [JP] Japan .................. 1-141419

[51] Int. Cl.$^5$ .................. C01F 11/02; C01G 3/02; C01G 21/02; H01L 39/12
[52] U.S. Cl. .................. 505/1; 252/521; 423/604; 423/617; 423/619; 501/123; 505/782
[58] Field of Search .................. 505/182, 1; 252/518, 252/521; 501/123; 423/604, 617, 619, 635

[56] References Cited

U.S. PATENT DOCUMENTS

3,932,315  1/1976  Sleight .................. 505/802
4,880,771 11/1989  Cava .................. 252/518

OTHER PUBLICATIONS

Mei "Superconductivity in Y Ba$_{2-x}$Cu$_3$O$_{7-y}$...".
Wada "Annealing Effect of High-Tc Superconducting ..." Jap. Jnl. Appl. Phys. vol. 26(9) Sep. 1987 pp. L1475-L1477.
Tokiwa "Crystal Structure and Superconductivity Controlled..." Jap. Jnl. Appl. Phys. vol. 27(6) Jun. 1988 pp. L1009-L1012.
Zuyao "Supercoductivity in the (Bi,Pb)-Ca-Sr-Ba-Cu-O System" Solid State Comm. vol. 70(2) Apr. 1989 pp. 133-135.
Sheng "New 120K Ti-Ca-BA-Cu-O Superconductor" Appl. Phys. Lett. vol. 52(20) May 16, 1988 pp. 1738-1740.
Yamada "Pb Introduction to the High-Tc Superconductor Bi-Sr-Ca-Cu-O" Jap. Junl. Appl. Phys. vol. 27(6) Jun. 1988 pp. L996-L998.
Dominguez "Superconductive Phases at . . . Y$_{3-x}$(Ba,Sr)$_x$Cu$_3$O$_{5-y}$" Mat. Res. Soc. Symp. Proc. Vol. 91 Nov.-Dec., 1987 pp. 951-955.
Kawai et al., "Japanese Journal of Applied Physics", 27(12) 2296-2299 (Dec., 1988).
Takano et al., "Japanese Journal of Applied Physics", 27(6) 1041-1043 (Jun., 1988).
Thanh et al., "Applied Physics", 22 205-212 (1980).

*Primary Examiner*—Paul Lieberman
*Assistant Examiner*—John Boyd
*Attorney, Agent, or Firm*—Wenderoth, Lind & Ponack

[57] ABSTRACT

A Bi-Pb-Sr-Ba-Ca-Cu-O system superconductor having a composition of:

$$Bi_l Pb_m Sr_p Ba_q Ca_y Cu_z O_x$$

wherein l, m, p, q, y and z satisfy the following inequalities:

$0.50 < l < 1.50$ $0.01 \leq m \leq 0.60$ $0.70 \leq p \leq 1.60$ $0.005 \leq q \leq 0.80$ $0.70 \leq y \leq 1.60$ $1.40 \leq z \leq 3.00$ which has the critical temperature of at least 77 K, and contains the high T$_c$ phase in a high fraction.

2 Claims, 3 Drawing Sheets

BI-PB-SR-BA-CA-CU-O SYSTEM SUPERCONDUCTOR

BACKGROUND OF THE INVENTION

1. Field of the Invention

The present invention relates to a Bi-Pb-Sr-Ba-Ca-Cu-O system superconductor which is based on a Bi-Sr-Ca-Cu-O system superconductor which attracts attention since it exhibits superconductivity at 77K or higher, in some cases at 100K or higher.

2. Description of the Related Art

The National Institute for Metals reported that in a sintered body of $Bi_1Sr_1Ca_1Cu_2O_x$, electrical resistance began to drop at 120K, sharply dropped till 107K and became zero at about 75K. The reported material contains two superconductive phases one of which has the superconductive transition termination temperature of about 105K which temperature was obtained by extrapolation of the measured data (high $T_c$ phase) and the other of which has the superconductive transition termination temperature of about 75K (low $T_c$ phase) and the whole material does not necessarily consists of the high $T_c$ phase. However, the Meissner effect was observed with this material.

The reported superconductive material contains no rare earth element and is more stable to water and the like than the Y-Ba-Cu-O system superconductor.

Takano et al reported that the addition of lead (Pb) to the Bi-Sr-Ca-Cu-O system superconductor increased the volume fraction of high $T_c$ phase having $T_c$ of about 107K to the range between 80% and about 100% (Jpn. J. Appl. Phys., 27, 1988, L1041-1043).

Most of the reported Bi-Sr-Ca-Cu-O system superconductors contain both the high $T_c$ phase and the low $T_c$ phase. Although the addition of lead increases the fraction of high $T_c$ phase, the production conditions are not made clear, and reproducibility has to be improved.

SUMMARY OF THE INVENTION

One object of the present invention is to provide a novel Bi-Pb-Sr-Ba-Ca-Cu-O system superconductor containing the high $T_c$ phase in a higher fraction.

Another object of the present invention is to provide a novel Bi-Pb-Sr-Ba-Ca-Cu-O system superconductor, which can be produced with good reproducibility.

These and other objects of the present invention are achieved by a Bi-Pb-Sr-Ba-Ca-Cu-O system superconductor having a composition of:

$$Bi_lPb_mSr_pBa_qCa_yCu_zO_x$$

wherein l, p, q, y and z satisfy the following inequalities:

$0.50 < l < 1.50$ $0.01 < m \leq 0.60$ $0.70 < p \leq 1.60$ $0.005 \leq q \leq 0.80$ $0.70 \leq y \leq 1.60$ $1.40 \leq z \leq 3.00$.

DETAILED DESCRIPTION OF THE INVENTION

Figure 1:
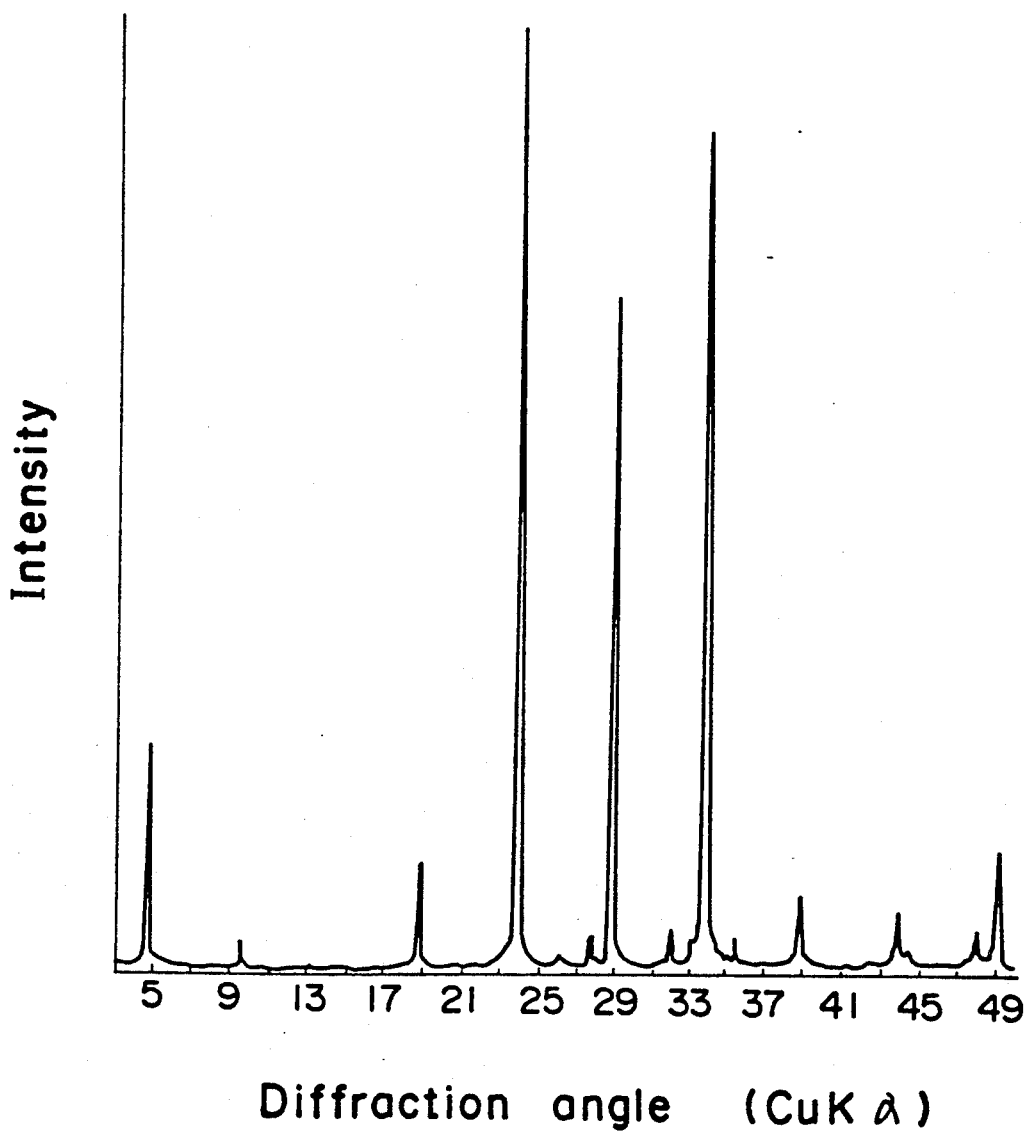
FIG. 1 is the X-ray diffraction pattern of the superconductor obtained in Example 1.

The superconductor of the present invention is characterized in the addition of barium to the Bi-Pb-Sr-Ca-Cu-O system superconductor. When the content of barium, namely "q" in the above composition formula is larger than 0.80, the high $T_c$ phase of 107K is hardly formed. When it is less than 0.005, little effect of the addition of barium is achieved.

The superconductor of the present invention can be prepared as follows:

As the raw materials, $Bi_2O_3$, $SrCO_3$, $BaCO_3$, $CaCO_3$, CuO and PbO are weighed in a desired molar ratio and mixed, or carboxylates such as oxalates or citrates containing Bi, Pb, Sr, Ba, Ca and Cu in a desired molar ratio are synthesized by a coprecipitation method. In this step, the molar ratio of Bi, Sr, Ba, Ca and Cu may be almost the same as that in the final product, but Pb may be used in a ratio more than that in the final product since a part of Pb is evaporated during thermal treatment. The powder mixture or the carboxylate mixture is heated and reacted in the solid phase in the air at about 800° C. When the carboxylates are used, preferably the mixture is thermally decomposed at about 250° C. and then reacted at about 800° C. The heated mixture is ground and pelletized under pressure of about 500 to 1,000 kg/cm². Then, the pellet is sintered at a temperature of 810° to 845° C. for at least 30 hours.

Now, the relationship between the properties of the Bi-Pb-Sr-Ba-Ca-Cu-O system superconductor and the molar ratio of the component elements or the production conditions is explained.

The superconductive critical temperature of the produced superconductor is greatly influenced by the molar ratio of the component elements. When the mole number of copper is 2, the preferred molar ratio of other elements is  $Bi_{0.7-1.2}Pb_{0.01-0.25}Sr_{0.6-1.3}Ba_{0.005-0.40}Ca_{0.9-1.3}Cu_2$. In this molar ratio range, it is highly probable that the superconductor contains the high $T_c$ phase having the $T_c$ of 107K or higher in a volume fraction of at least 80%.

In the production of the superconductor of the present invention, the raw material can be prepared by two ways as described above, namely mixing the raw material powders as such and coprecipitation of the carboxylates. By the latter way, the superconductors having the same properties are produced with good reproducibility, and the fraction of the high $T_c$ phase is increased.

PREFERRED EMBODIMENTS OF THE PRESENT INVENTION

The present invention will be illustrated by following Examples.

EXAMPLE 1

As the raw material powders, $Bi_2O_3$, PbO, $SrCO_3$, $BaCO_3$, $CaCO_3$ and CuO were weighed in a molar ratio of Bi:Pb:Sr:Ba:Ca:Cu of 0.70:0.30:0.90:0.10:1.00:1.80 and ground and mixed in a mortar. Then, the mixture was placed in an alumina boat and heated and reacted in the solid phase with an electric furnace in the air at 800° C. for 12 hours to obtain a black powder.

The black powder was again ground and mixed in a mortar, and the powder was pressed under pressure of about 600 kg/cm$^2$ to produce a pellet of about 1 cm in diameter and about 1 mm in thickness. The pellet was sintered with the electric furnace in the air at 845° C. for 96 hours.

With the sintered sample, the molar ratio of the component elements was examined with ICAP to find that the molar ratio of Bi:Pb:Sr:Ba:Ca:Cu was 0.70:0.11:0.90:0.09:0.95:1.80 when normalized with the mole number of Cu.

The X-ray diffraction pattern of the sintered sample is shown in FIG. 1, which confirms that the most fraction of the sample was the high $T_c$ phase of 107K having the C axis of 37.26 Å.

Figure 2:
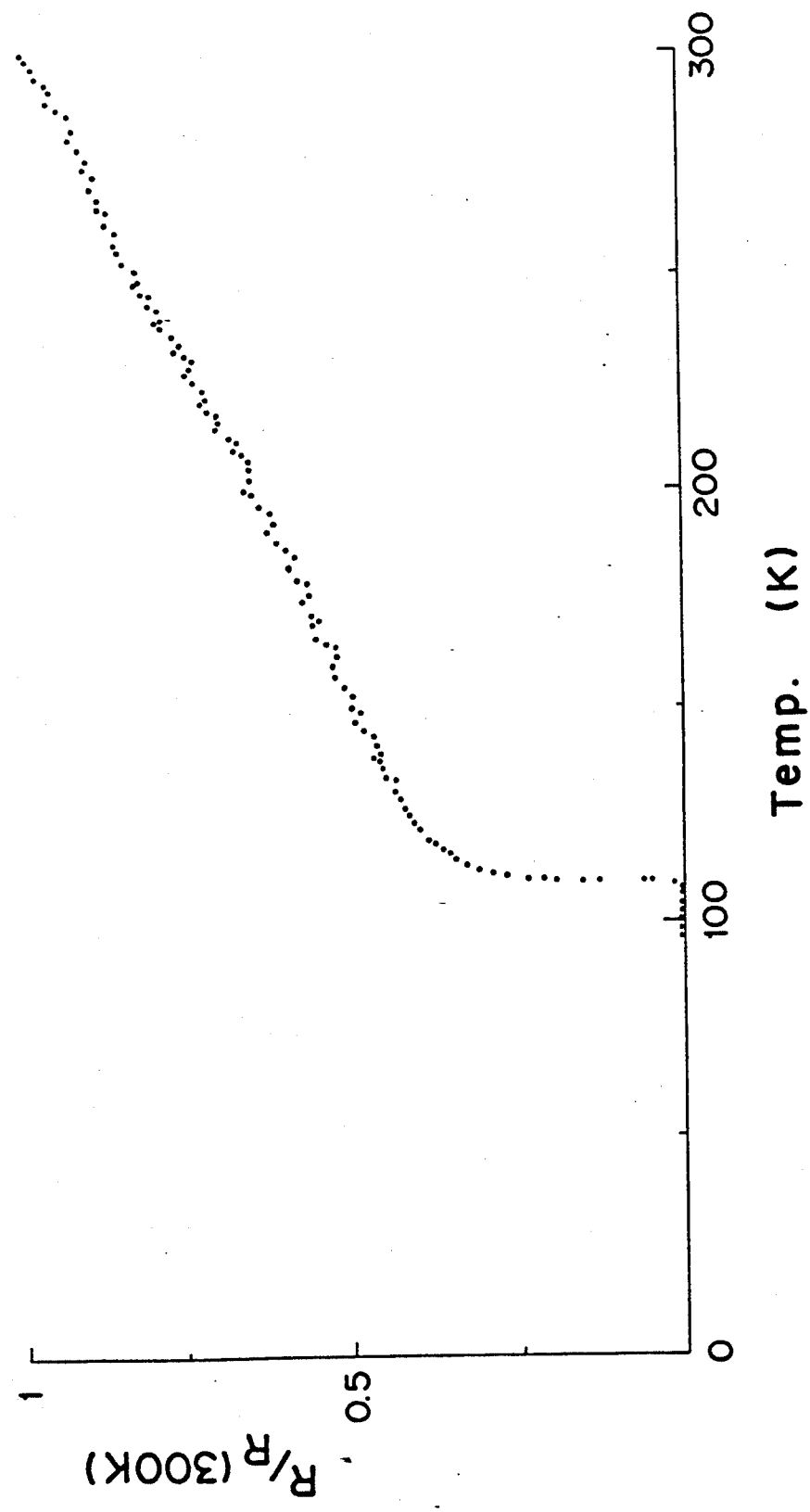
FIG. 2 is a graph showing temperature dependence of the electrical resistance of the superconductor prepared in Example 1.

The temperature dependence of the electrical resistance of this sample is shown in FIG. 2. From this graph, it is understood that the resistance began to drop from about 120K and dropped to zero at about 107K. This confirms that the produced material had good superconductive characteristics.

Figure 3:
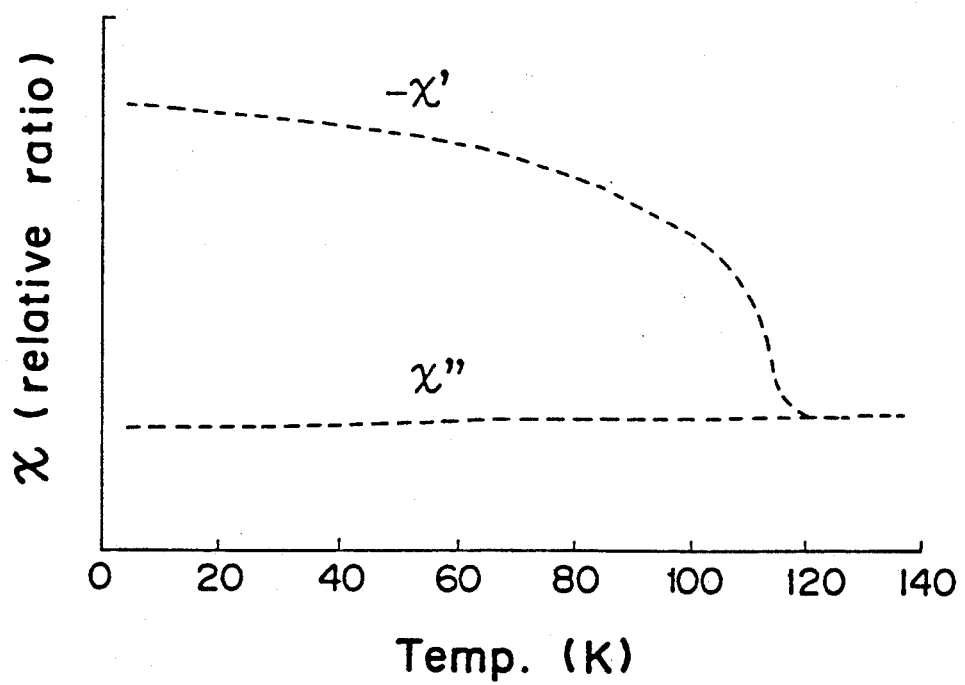
FIG. 3 is A. C. magnetic susceptibility measured with the superconductor prepared in Example 1.

The results of measurement of A. C. magnetic susceptibility are shown in FIG. 3, which confirms that the material became superconductive at about 107K.

EXAMPLE 2

As the raw material powders, $Bi_2O_3$, PbO, $SrCO_3$, $BaCO_3$, $CaCO_3$ and CuO were weighed in a molar ratio of Bi:Pb:Sr:Ba:Ca:Cu of 1.04:0.26:0.96:0.10:1.00:1.80 and ground and mixed in a mortar. Then, the mixture was placed in an alumina boat and heated and reacted in the solid phase with an electric furnace in the air at 800° C. for 24 hours to obtain a black powder.

The black powder was again ground and mixed in a mortar, and the powder was pressed under pressure of 600 kg/cm$^2$ to produce a pellet of about 1 cm in diameter and about 1 mm in thickness. The pellet was sintered with the electric furnace in the air at 827° C. for 96 hours.

With the sintered sample, the molar ratio of the component elements was examined with ICAP to find that the molar ratio of Bi:Pb:Sr:Ba:Ca:Cu was 0.96:0.13:0.96:0.09:0.90:1.80 when normalized with the mole number of Cu.

The X-ray diffraction pattern, the temperature dependence of the electrical resistance and the A. C. magnetic susceptibility of this sample were substantially the same as those in Example 1. This confirms that the sample of Example 2 contained the high $T_c$ phase of 107K in the fraction of about 100%.

EXAMPLE 3

To a solution of nitrates of Bi, Pb, Sr, Ba, Ca and Cu, ammonium oxalate was added to coprecipitate oxalates in which the molar ratio of Bi:Pb:Sr:Ba:Ca:Cu was 0.96:0.24:0.94:0.10:1.00:1.60. The coprecipitated oxalates were dried at 100° C., heated at 250° C. and then heated with the electric furnace in the air at 800° C. for 24 hours to obtain a black powder.

The black powder was ground and mixed in a mortar, and the powder was pressed under pressure of about 1,000 kg/cm$^2$ to produce a pellet of about 1 cm in diameter and about 1 mm in thickness. The pellet was sintered with the electric furnace in the air at 830° C. for 90 hours.

With the sintered sample, the molar ratio of the component elements was examined with ICAP to find that the molar ratio of Bi:Pb:Sr:Ba:Ca:Cu was 0.95:0.06:0.94:0.09:1.00:1.60 when normalized with the mole number of Cu.

The X-ray diffraction pattern, the temperature dependence of the electrical resistance and the A. C. magnetic susceptibility of this sample were substantially the same as those in Example 1. This confirms that the sample of Example 3 contained the high $T_c$ phase of 107K in the weight fraction of about 100%.

EXAMPLE 4

In the same manner as in Example 3, oxalates of the molar ratio of $Bi_{0.70}Pb_{0.30}Sr_{0.70}Ba_{0.30}Ca_{1.00}Cu_{1.80}$ or $Bi_{0.96}Pb_{0.24}Sr_{0.80}Ba_{0.20}Ca_{1.00}Cu_{1.60}$ were coprecipitated.

Then, in the same manner as in Example 3, the sintered pellet was produced.

With the sintered pellet, the molar ratio of the component elements was examined with ICAP to find that the molar ratio of Bi:Pb:Sr:Ba:Ca:Cu was 0.70:0.07:0.70:0.28:1.00:1.80 or 0.96:0.06:0.80:0.20:1.00:1.60 when normalized with the mole number of Cu.

The X-ray diffraction pattern, the temperature dependence of the electrical resistance and the A. C. magnetic susceptibility of this sample were substantially the same as those in Example 1. This confirms that the sample of Example 4 contained the high $T_c$ phase of 107K in the weight fraction of about 100%.

EXAMPLE 5

In the same manner as in Example 3, oxalates of the molar ratio of $Bi_{1.11}Pb_{0.22}Sr_{1.11}Ba_{0.05}Ca_{1.11}Cu_{2.00}$, $Bi_{1.07}Pb_{0.53}Sr_{1.33}Ba_{0.03}Ca_{1.33}Cu_{2.00}$ or $Bi_{1.09}Pb_{0.36}Sr_{1.21}Ba_{0.01}Ca_{1.21}Cu_{2.00}$ were coprecipitated.

Then, in the same manner as in Example 3, the oxalate powder was pelletized and sintered with the electric furnace in the air at 855° C. for 24 hours. Again, the pellet was ground and pelletized. The pellet was again sintered with the electric furnace in the air at 855° C. for 70 hours.

With the sintered pellet, the molar ratio of the component elements was examined with ICAP to find that the molar ratio of Bi:Pb:Sr:Ba:Ca:Cu was 1.05:0.09:1.08:0.04:1.07:2.00, 1.01:0.21:1.28:0.02:1.25:2.00 or 1.03:0.15:1.15:0.009:1.13:2.00 when normalized with the mole number of Cu.

From the X-ray diffraction patterns, the pellets contained the high $T_c$ phase in the weight fraction of about 100%. From the measurement of the temperature dependency of electrical resistance, three samples had critical temperatures of 108K, 115K and 110K.

The Bi-Pb-Sr-Ba-Ca-Cu-O system superconductor of the present invention has a superconductive critical temperature of at least 70K, in some cases at least 105K.

This superconductor can be easily produced as described above at a lower sintering temperature in a shorter sintering time than the system containing no barium. Particularly, in case of the coprecipitation method, the reproducibility of the product is improved and the fraction of the high $T_c$ phase can be increased.

What is claimed is:

1. A Bi-Pb-Sr-Ba-Ca-Cu-O system superconductor having a composition consisting essentially of:

$Bi_lPb_mSr_pBa_qCa_yCu_zO_x$ wherein l, m, p, q, y and z satisfy the following inequalities:

$0.50 < l < 1.50$ $0.01 \leq m \leq 0.60$ $0.70 \leq p \leq 1.60$ $0.005 \leq q \leq 0.80$ $0.70 \leq y \leq 1.60$ $1.40 \leq z \leq 3.00$, said superconductor being produced wherein the oxygen content of said superconductor is that produced by heating Bi, Pb, Sr, Ba, Ca, Cu compounds in an oxygen containing atmosphere.

2. The Bi-Pb-Sr-Ba-Ca-Cu-O system superconductor according to claim 1, wherein the molar ratio Bi:Pb:Sr:Ba:Ca:Cu is 0.7–1.2:0.01–0.25:0.6–1.3:0.005–0.40:0.9–1.3:2 when normalized with the Cu mole number of 2.

* * * * *